United States Patent
Pihet

(10) Patent No.: US 10,120,434 B2
(45) Date of Patent: Nov. 6, 2018

(54) SEMICONDUCTOR DEVICE CHIP PACKAGE WITH ELECTRONIC SWITCHING USING DEDICATED GROUND PIN COUPLED TO A VIRTUAL GROUND NODE

(71) Applicant: Infineon Technologies AG, Neubiberg (DE)

(72) Inventor: Eric Pihet, Munich (DE)

(73) Assignee: Infineon Technologies AG, Neubiberg (DE)

( * ) Notice: Subject to any disclaimer, the term of this patent is extended or adjusted under 35 U.S.C. 154(b) by 224 days.

(21) Appl. No.: 15/154,455

(22) Filed: May 13, 2016

(65) Prior Publication Data

US 2017/0329388 A1    Nov. 16, 2017

(51) Int. Cl.
| G06F 3/00 | (2006.01) |
| G06F 1/32 | (2006.01) |
| H03K 3/356 | (2006.01) |
| G06F 13/40 | (2006.01) |
| G06F 13/42 | (2006.01) |

(52) U.S. Cl.
CPC ........ *G06F 1/3287* (2013.01); *G06F 13/4022* (2013.01); *G06F 13/4286* (2013.01); *H03K 3/356* (2013.01)

(58) Field of Classification Search
CPC .................................................. G06F 1/3287
See application file for complete search history.

(56) References Cited

U.S. PATENT DOCUMENTS

| 7,834,684 | B2 * | 11/2010 | Fallah et al. | G05F 1/10 |
| 8,411,527 | B1 * | 4/2013 | Tuan | G11C 7/00 |
| 8,841,892 | B2 * | 9/2014 | Nagda et al. | G05F 1/577 |
| 9,356,593 | B2 * | 5/2016 | Pan | H03M 1/1245 |
| 2017/0286347 | A1 * | 10/2017 | Hinderer | G06F 1/266 |

OTHER PUBLICATIONS

"TLE7250GVIO, High Speed CAN Transceiver," Automotive Power, Infineon Data Sheet, Rev. 1.0, Mar. 14, 2012, 23 pp.

* cited by examiner

*Primary Examiner* — Tammara R Peyton
(74) *Attorney, Agent, or Firm* — Shumaker & Sieffert, P.A.

(57) ABSTRACT

A semiconductor device is described herein. In accordance with one exemplary embodiment the semiconductor device includes a chip package, which includes at least one semiconductor chip, a dedicated ground pin, a first supply pin for receiving a first supply voltage, a second supply pin for receiving a second supply voltage, and a first input pin. The semiconductor device further includes a first circuit integrated in the semiconductor chip, wherein the first circuit is coupled to the first supply pin and to the ground pin, and a second circuit integrated in the semiconductor chip, wherein the second circuit is coupled to the first supply pin and to a virtual ground node. An electronic switch is configured to connect the virtual ground node with the first input pin dependent on the level of a first input signal.

35 Claims, 7 Drawing Sheets

SEMICONDUCTOR DEVICE CHIP PACKAGE WITH ELECTRONIC SWITCHING USING DEDICATED GROUND PIN COUPLED TO A VIRTUAL GROUND NODE

TECHNICAL FIELD

The disclosure relates to the field of bus transceivers, in particular to a Controller Area Network (CAN) transceiver, which may be used to interconnect various electronic devices within an automobile.

BACKGROUND

Modern automobiles may have up 70 (or even more) electronic control units (ECU) for controlling the operation of various subsystems. Such subsystems may be, inter alia, engine management system, transmission control system, airbags control system, antilock braking system, cruise control, steering assist systems, multimedia and navigation systems, central locking system, mirror adjustment, battery management system, recharging systems for hybrid/electric cars, etc. Some of these subsystems may operation independently from subsystems, but communication between the ECUs of different subsystems may be essential. The Controller Area Network (CAN) standard was devised for this purpose. Although, CAN was developed for the use in automobiles, a CAN bus may also be used as a fieldbus in general industrial environments. Generally, a CAN bus may be regarded as a two-wire bus system with differential signaling.

The CAN specification was initially published by the Robert Bosch GmbH and later standardized by the International Organization for Standardization (ISO) as CAN standard ISO 11898, which was later restructured into two parts: ISO 11898-1 covering the data link layer, and ISO 11898-2 covering the CAN physical layer for high-speed CAN.

To connect electronic circuits to a CAN bus specific integrated CAN transceiver circuits (transceiver ICs) have been developed. In various automotive and industrial applications relatively high electromagnetic compatibility (EMC) standards are to be complied with to keep electromagnetic emission and electromagnetic interferences (EMI) at a sufficiently low level. A circuit design, which ensures that the common mode voltage of the bus lines remains approximately constant, may help to reduce electromagnetic emissions in a lower frequency range (e.g. up to 100 MHz). To reduce the electromagnetic emissions at high frequencies (e.g. 100 MHz and more) common-mode chokes may be used.

SUMMARY

A semiconductor device is described herein. In accordance with one embodiment the semiconductor device comprises a chip package that includes at least one semiconductor chip, a dedicated ground pin, a first supply pin for receiving a first supply voltage, a second supply pin for receiving a second supply voltage, and a first input pin. A first circuit is integrated in the semiconductor chip and coupled to the first supply pin and to the ground pin. A second circuit is integrated in the semiconductor chip and coupled to the first supply pin and to a virtual ground node. An electronic switch is configured to connect the virtual ground node with the first input pin dependent on the level of a first input signal.

In accordance with another embodiment the semiconductor device comprises a chip package that includes at least one semiconductor chip, a dedicated ground pin, a first supply pin for receiving a first supply voltage, a second supply pin for receiving a second supply voltage, and a first input pin for receiving an input signal. A first circuit is integrated in the semiconductor chip and coupled to the first supply pin and to the ground pin. A second circuit is integrated in the semiconductor chip and coupled to the first supply pin and to a virtual ground node, wherein the virtual ground node is at least temporarily connected to the first input pin. When the virtual ground node is connected to the first input pin and the first input signal, which is received at the first input pin, is at a low voltage level, a second supply current passes through the second circuit from the second supply pin to the virtual ground node, while the voltage drop across the second circuit substantially corresponds to the second supply voltage.

Moreover, a bus transceiver circuit is described herein. In accordance with one embodiment, the bus transceiver circuit comprises a transmitter portion configured to receive a input data signal and to generate a corresponding first bus signal that is operably applied to at least one bus line. The transmitter portion of the transceiver circuit is supplied with a first supply voltage and connected to a first ground pad. The bus transceiver circuit further comprises a receiver portion operably coupled to the at least one bus line to receive a second bus signal and configured to generate a corresponding receive signal. An output buffer is included in the receiver portion of the transceiver circuit. The output buffer receives the receive signal and generates a corresponding output data signal. The output buffer is supplied with a second supply voltage and connected to a second ground pad that is separate from the first ground pad.

Furthermore, a transceiver device for interfacing with a data bus is described herein. In accordance with one embodiment the device comprises a chip package that has at least a first supply pin, a second supply pin, a ground pin, an input data pin, an output data pin, at least one bus pin for connecting at least one bus line, and a further pin. A semiconductor chip includes a receiver circuit and a transmitter circuit. The transmitter circuit is configured to receive an input data signal at the input data pin and to provide a corresponding first bus signal at the at least one bus pin. The transmitter circuit is supplied with a first supply voltage applied at the first supply pin and is connected to the first ground pin. The receiver circuit is operably coupled to the at least one bus pin to receive a second bus signal and configured to generate a corresponding receive signal. The receiver circuit includes an output buffer that receives the receive signal and generates a corresponding output data signal at the output data pin. The output buffer is supplied with a second supply voltage applied at the second supply pin and is connected to a circuit node, which is configured to be connected to the further pin.

Moreover, a method performed in a semiconductor device is described herein. The semiconductor device includes a chip package with at least one semiconductor chip, a dedicated ground pin, a first supply pin for receiving a first supply voltage, a second supply pin for receiving a second supply voltage, and a first input pin. A first circuit is integrated in the semiconductor chip and is coupled to the first supply pin and to the ground pin. A second circuit is integrated in the semiconductor chip and is coupled to the first supply pin and to a virtual ground node. In accordance with one embodiment the method comprises receiving a first input signal at the first input pin; and connecting, using an electronic switch, the virtual ground node with the first input pin dependent on the level of a first input signal.

Furthermore, a system that includes a controller device, which has an output pin, and a semiconductor device is described herein. In accordance with one embodiment of the system the semiconductor device comprises a chip package including at least one semiconductor chip, a dedicated ground pin, a first supply pin for receiving a first supply voltage, a second supply pin for receiving a second supply voltage, and a first input pin connected to the output pin of the controller device. A first circuit is integrated in the semiconductor chip and coupled to the first supply pin and to the ground pin. A second circuit is integrated in the semiconductor chip and coupled to the first supply pin and to a virtual ground node. An electronic switch is configured to connect the virtual ground node with the first input pin dependent on the level of a input signal.

BRIEF DESCRIPTION OF THE DRAWINGS

The details of this disclosure can be better understood with reference to the following description and drawings. The components in the figures are not necessarily to scale, emphasis instead being placed upon illustrating the principles of this disclosure. Moreover, in the figures, like reference numerals designate corresponding parts. In the drawings.

DETAILED DESCRIPTION

The embodiments described herein relate to bus transceiver circuits for a Controller Area Network (CAN) and its use. However, the concepts described herein may be readily used together with other bus systems (e.g. Serial Peripheral Interface (SPI) bus systems or fieldbus systems such as FlexRay) and, therefore, the present disclosure is not limited to applications using a CAN bus for exchanging data.

Figure 1:
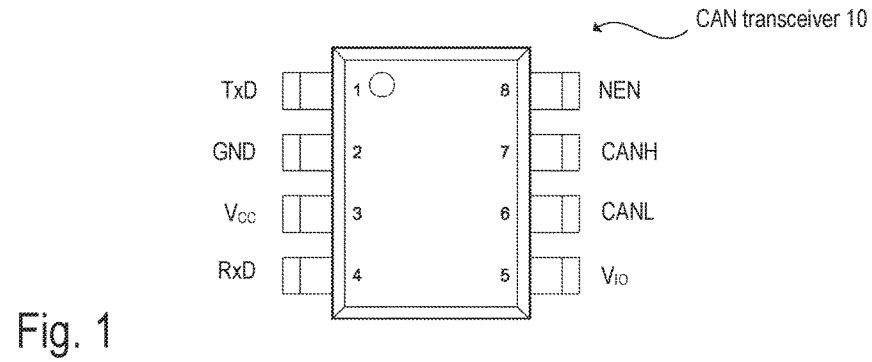
FIG. 1 illustrate one exemplary integrated CAN transceiver circuit arranged in a Dual Small Outline (DSO) Package.

FIG. 1 illustrates an 8-pin chip package which includes an integrated transceiver circuit 10 that may be used to couple, for example, a micro controller to a the data lines of a CAN bus. In the present example a Dual Small Outline (DSO) package is used (similar to Small Outline Integrated Circuit, SOIC). However, any other type of chip package may be used. In a general embodiment, pins 7 and 8 (labelled CANH and CANL) are coupled to the data lines of the CAN bus. A CAN bus link includes two data lines as differential signaling is used. Pins 1 and 4 (labelled RxD and TxD) may be connected to corresponding input and output pins of a micro controller (see also FIG. 7). In this case, the microcontroller may generate a binary input data signal, which is supplied to the TxD pin of the CAN transceiver 10. The input data signal may, for example, represent a stream of 0-bits and 1-bits, which is to be transmitted across the CAN bus. Similarly, the transceiver circuit 10 may generate an output data signal that is provided at the RxD in of the CAN transceiver 10. The output data signal represents a signal received from the CAN bus and may be supplied to the microcontroller for further processing of the received data.

The input data signal and pin TxD and the output data signal at pin RxD usually are binary signals that have only two valid signal levels, a low level and a high level. The signal level of the input and output data signals may be depend on the supply voltage (voltage $V_{IO}$) and the corresponding reference potential (ground) used by the microcontroller coupled to the transceiver circuit. Therefore, the voltage rail providing the supply voltage for the microcontroller is also connected to the transceiver circuit 10, in the present example at pin 5 labelled $V_{IO}$. The supply voltage for the transceiver circuit 10 is applied to pin 3 labelled $V_{CC}$. The supply voltages at the pins $V_{CC}$ and $V_{IO}$ may be different. For example, the CAN bus usually uses a voltage swing of +/−5V between the data lines of the CAN bus, whereas many microcontrollers operate at lower supply voltages of, e.g. 3.3V. Pin 2 is connected to the reference potential (ground potential), and in the present example the transceiver circuit has a mode selection pin, which is, in the present example, an enable pin (pin 8 labelled NEN) to receive an enable signal, whereas a low level at the NEN pin causes the transceiver circuit 10 to operate in a normal mode and a high level at the NEN pin causes the transceiver circuit 10 to operate in a low-power mode (sleep mode). However, it should be noted that the low-power mode is an optional feature and may be omitted in some embodiments.

Figure 2:
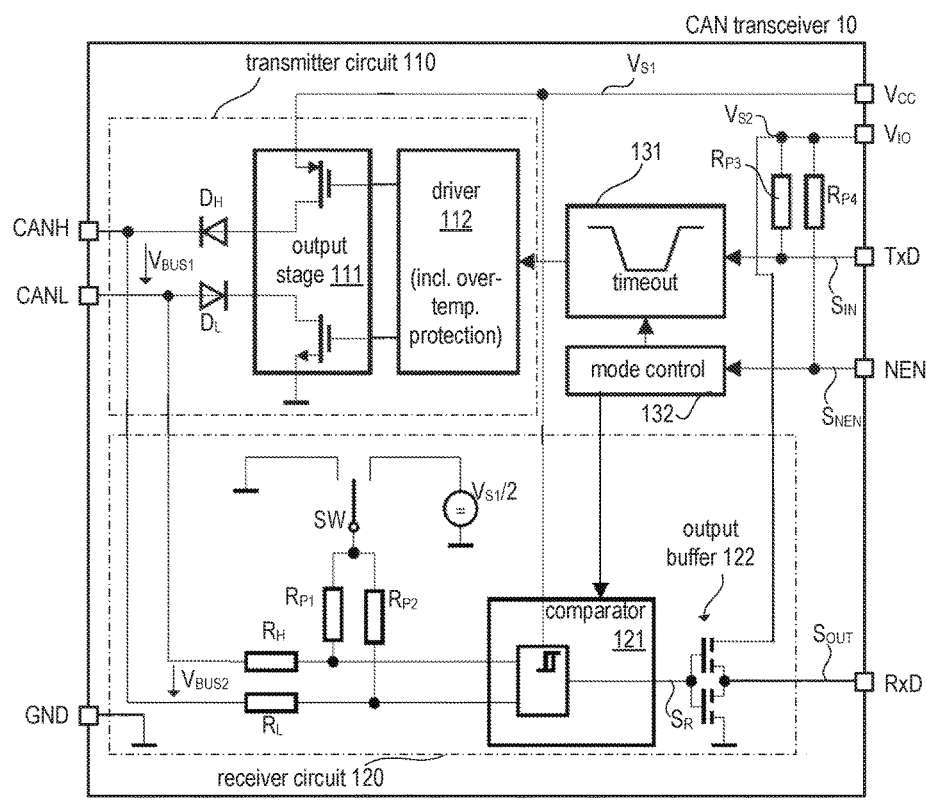
FIG. 2 is a block diagram illustrating an exemplary CAN transceiver circuit.

FIG. 2 is a block diagram illustrating an exemplary CAN bus transceiver circuit 10 that may be used as an interface between the bus lines and, e.g., a microcontroller. According to the present example, the bus transceiver circuit 10 includes a transmitter portion and a receiver portion (transmitter circuit 110 and receiver circuit 120). The transmitter circuit 110 is configured to receive an input data signal $S_{IN}$ at pin TxD and to generate a corresponding first bus signal $V_{BUS1}$, which is output at the bus lines connected to pins CANH and CANL. The transmitter circuit 110 includes an output stage 111, which is supplied with a first supply voltage $V_{S1}$ (applied at pin $V_{CC}$, e.g. by an external supply circuit) and connected to a first ground pad that is connected to pin GND which his coupled to a reference (ground) potential. In the present example of a CAN bus, differential signaling is used. That is, the first bus signal $V_{BUS1}$ is set to a voltage level of approximately $V_{S1}$ to signal a 0-bit (dominant bit), and the to a voltage level of approximately zero volts to signal a 1-bit (recessive bit). The common-mode voltage at pins CANH and CANL should be approximately constant at a voltage $V_{S1}/2$ (half of the supply voltage at pin $V_{CC}$). The dominant bit is generated by activating both transistors of the transmitter output stage 111, which actively sets the differential voltage $V_{BUS}$ at pins CANH and CANL to a high level), whereas a recessive bit is generated by deactivating both transistors of the transmitter output stage 11, which allows the pullup resistors $R_H$, $R_{P1}$, $R_L$ and $R_{P2}$ (and further external pull-up resistors) to pull the (single-ended) voltage at pins CANH and CANL to the voltage level $V_{S1}/2$ (i.e. the differential voltage becomes zero volts).

The transmitter circuit 110 usually includes a driver circuit 112, which is configured to generated gate signals for the transistors in the output stage 111 based on an input data signal $S_{IN}$ received at pin TxD. The input data signal $S_{IN}$ represents the data to be transmitted across the CAN bus and may be a serial bit stream, which is generated, for example, by an external microcontroller. In the present example, the driver circuit 112 receives the input data signal $S_{IN}$ from the pin TxD via timeout circuit 131. The timeout circuit 131 is configured to set the input data signal $S_{IN}$ to a voltage level representing an (recessive) 1-bit, when it remains at a level representing a (dominant) 0-bit for more than a defined time period. Such a timeout function ensures that the CAN bus is not blocked in case the input data signal $S_{IN}$ continuously indicates a dominant 0-bit, which may be the case, for example, when the microcontroller, which generates the input data signal $S_{IN}$, crashes or got stuck for whatever reason. However, it is noted that the timeout function is optional and the timeout circuit 131 may be omitted.

The mode control circuit 132 is also optional and only needed in case a low-power or sleep mode is implemented. The mode control circuit 132 receives an enable signal $S_{NEN}$ from pin NEN and is configured to put various portions of the transceiver into a low-power or sleep mode when the enable signal $S_{NEN}$ is at a high level. A low level of the enable signal $S_{NEN}$ indicates a normal mode of operation. In the present example, the signals $S_{NEN}$ and $S_{IN}$ are pulled, by pull-up resistors $R_{P3}$ and $R_{P4}$, towards the second supply voltage $V_{S2}$ provided at pin $V_{IO}$, unless the microcontroller (or any other circuitry) does not actively generate a zero level at the respective pins TxD and NEN. The second supply voltage $V_{S2}$ (at pin $V_{IO}$) may be, for example, 3.3 V, as it is only used to for generating the logic levels of the logic signals between transceiver circuit 10 and, e.g. a microcontroller. In contrast thereto, the first supply voltage $V_{S1}$ (at pin $V_{CC}$) is needed to generate the bus signal $V_{BUS1}$ output at the CAN bus lines, and therefore usually has to be 5 V or higher.

As can be seen from FIG. 2, the receiver circuit 120 basically includes a comparator circuit 121 and an output buffer 122 coupled to the output of the comparator circuit 121. The comparator receives a second bus signal $V_{BUS2}$ from the bus lines (in case of a CAN bus at pins CANH and CANL) and compares the signal level of the second bus signal $V_{BUS2}$ with predefined threshold values $TH_R$ and $TH_D$, to determine the corresponding logic level. To avoid confusion, the second bus signal $V_{BUS2}$ is a signal received from another device via the bus lines (connected to pins CANH and CANL), whereas the first bus signal $V_{BUS1}$ (generated by the transceiver circuit 110) is a signal transmitted to another device via the bus lines. The mentioned threshold may be, for example, $TH_R=0.65$ V and $TH_D=0.75$ V. In this example, a recessive 1-bit is detected when $V_{BUS2} \leq 0.65$ V and a dominant 0-bit is detected when $V_{BUS1} \geq 0.75$ V. However, other threshold values may be used. In an ideal case, $V_{BUS2} \approx 0$ V to signal a recessive 1-bit and $V_{BUS2} \approx 5$ V to signal a dominant 0-bit. In the example of FIG. 2, the two inputs of the comparator circuit 121 are connected to the pins CANH and CANL via resistors $R_H$ and $R_L$. However, due to the voltage drop across the diodes $D_H$ and $D_L$ as well as the voltage drop across the transistors in the transmitter output state 111 the actual high level of the bus signal $V_{BUS1}$ is approximately 3V for a supply voltage $V_{S1}$ of 5V. The two inputs of the comparator circuit 121 are connected to a circuit node supplied with a bias voltage of $V_{S1}/2$ via pull-up resistors $R_{P1}$ and $R_{P2}$. In sleep or power-down mode, the circuit node may be connected to the ground pin (via switch SW). The bias voltage $V_{S1}/2$ defines the common-mode voltage of the bus lines at pins CANH and CANL. The voltage drop across the resistors $R_H$ and $R_L$ is neglected in the following explanation. However, in fact the resistor pairs $R_H$, $R_{P1}$ and $R_L$, $R_{P2}$ form voltage dividers to down-scale the level of the bus signal $V_{BUS2}$ "seen" by comparator circuit 121. The comparator circuit 121 generates, at its output, a low level (e.g. 0 V), when the differential bus voltage $V_{BUS2}$ exceeds the threshold $TH_D$, and a high level (e.g. $V_{S1}$), when the differential bus voltage $V_{BUS2}$ falls below the threshold $TH_R$. That is, the comparator circuit 121 has a hysteresis of $TH_D$–$TH_R$ to avoid undesired toggling.

The comparator output signal is denoted as $S_R$. As mentioned, the voltage levels of the comparator output signal $S_R$ are determined by the supply voltage $V_{S1}$ and the reference potential at the ground pin GND. However, it should be mentioned that the comparator circuit 121 is not necessarily supplied by the same supply voltage $V_S$ as the transmitter circuit 110. The second supply voltage $V_{S2}$ (present at pin $V_{IO}$) or any other internal supply voltage may be used instead. In the present example, a low level indicates a 1-bit and a high level indicates a 0-bit. However, this is also not necessarily the case, and the levels may be inverted in other embodiments. The output buffer 122 is coupled to the output of the comparator 121 and configured to generate an output data signal $S_{OUT}$ that is provided at the RxD pin. A microcontroller connected to that RxD pin is thus able to read and process the data included in the output data signal $S_{OUT}$. In the present example, the output buffer 122 includes a push-pull-output stage composed of two transistors connected between ground and the $V_{IO}$ pin, at which the second supply voltage $V_{S2}$ is provided, which defines the high-level for signals at pins TxD, RxD and NEN. In the present example, the output buffer 122 does only buffer the comparator output signal $S_R$ and adjusts the high level in accordance with the second supply voltage $V_{S2}$.

In many applications the integrated CAN transceiver circuit 10 is arranged in a chip package as shown in FIG. 1. The chip package including the transceiver circuit 10 may be soldered to a printed circuit board (PCB) together with other devices such as the mentioned micro controller, a voltage regulator providing the supply voltages, etc. (see also FIG. 7). As mentioned above a common-mode choke may be arranged on the PCB between the CANH and CANL pins of the transceiver circuit 10 and the bus lines, which causes additional costs for the common-mode choke. However, when omitting a common-mode choke, noise in the radio frequency (RF) range may be generated at the bus, which may result in undesired electromagnetic interferences (EMI). The RF noise may be caused by a kind of modulation of the supply voltage $V_{S1}$. This modulation may be due to a varying voltage drop across the bond wires connecting the silicon die with the external GND and $V_{CC}$ pins. The varying voltage drop may be caused, for example, by a varying load current due to the switching operation in the transmitter and receiver circuits.

Further analysis and simulations have shown that some RF noise sources may be amplified, because the $V_{CC}$, $V_{IO}$ and GND pins of the transceiver circuit 10 are actually coupled by parasitic resistances, inductances and capacitances, which may form a parasitic resonance circuit. The equivalent circuit shown in FIG. 3 can be used to model the mentioned parasitic resonance circuit for the purpose of simulation. The circuit of FIG. 3 includes the transmitter circuit 110 as well as the receiver circuit 120, wherein the latter is basically modeled as a controllable current source Q generating a current $i_Q$ that represents the cross-conduction current, which occurs, e.g., in the receiver output buffer 122 (see. FIG. 2). The transmitter circuit 110 is connected to the $V_{CC}$ pin (at which the supply voltage $V_{S1}$ is supplied) via inductance $L_1$, and the receiver circuit 120 (current source Q) is connected to the $V_{IO}$ pin (at which the supply voltage $V_{S2}$ is supplied) via inductance $L_2$. Both, transmitter circuit 110 and receiver circuit 120, are connected to an internal ground node that is coupled to the GND pin via resistance $R_2$ and inductance $L_3$. A capacitance $C_1$ and a resistance $R_1$ are connected in series to each other in parallel to the transmitter circuit 110. Similarly, a capacitance $C_2$ and a resistance $R_2$ are connected in series to each other in parallel to the receiver circuit 120. It is noted, that the values given for $V_{S1}$, $V_{S2}$, $L_1$, $L_2$, $L_3$, $R_1$, $R_2$, $R_3$, $C_1$, and $C_2$ in FIG. 3 have to be regarded as an illustrative example, which is in no way limiting for the embodiments described herein. Furthermore, other, more sophisticated models may be used for simulating a transceiver circuit. The resistances and inductances of bond-wires may, for example, contribute to the parasitic inductances $L_1$, $L_2$, and $L_3$, and resistance $R_3$. The resistances of the on-chip wiring may contribute to resistances $R_1$ and $R_2$, and parasitic on-chip capacitances may contribute to capacitances $C_1$ and $C_2$.

Figure 3:
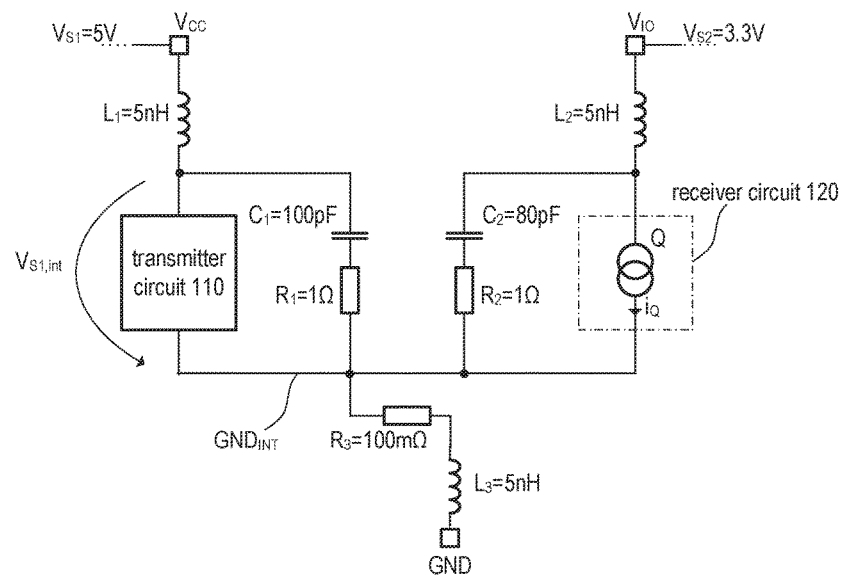
FIG. 3 is a circuit diagram illustrating an equivalent circuit for the CAN transceiver of FIG. 2 for the purpose of simulating undesired resonances.
Figure 4:
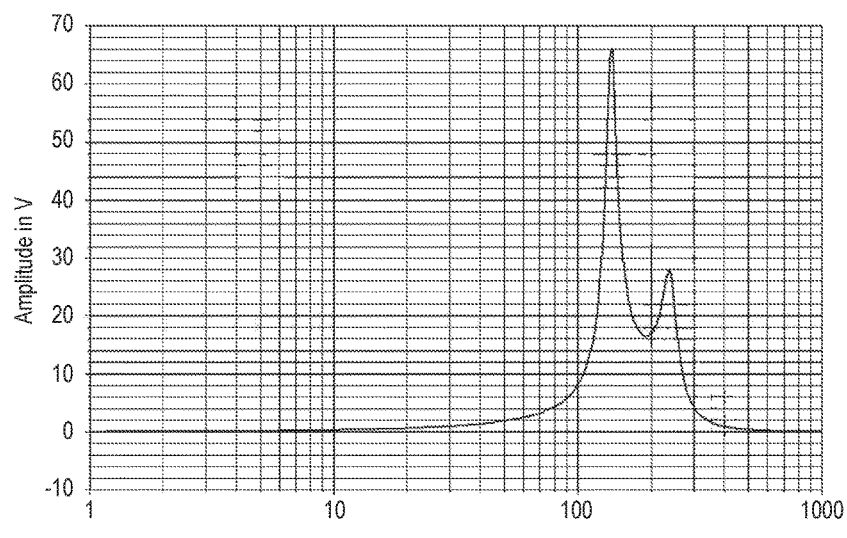
FIG. 4 is a diagram illustrating the frequency response of the supply voltage due to an undesired resonance of the CAN transceiver circuit at high frequencies.

The model illustrated in the FIG. 3 may be used to simulate the internal supply voltage $V_{S1,int}$ applied across the transmitter circuit 110 for various frequencies of the current $i_Q$. FIG. 4 illustrates a simulated frequency response of the mentioned internal supply voltage $V_{S1,int}$, which shows two resonance frequencies above 100 MHz (one peak at approximately 130 MHz and a second peak at approximately 220 MHz). The resonances significantly lead to an increased noise level in the frequency range between 100 and 300 MHz. The actual numbers may be different in different implementations. The resonances may be damped, for example, by including a resistance between the output buffer 122 and the $V_{IO}$ pin. However, although such a resistance may reduce the emission of noise at the bus lines, the remaining emissions may be still above the desired limits.

To disconnect the feedback loop of the above-mentioned parasitic resonance circuit, the $V_{IO}$ and $V_{CC}$ pins of the transceiver circuit are decoupled. In some embodiments, this decoupling is achieved by the output buffer (represented by current source Q in the model of FIG. 3) of receiver portion of the bus transceiver circuit being connected to a ground pad that is connected to a pin separate from the ground pin GND. In one embodiment, the ground pad of the output buffer may be connected to a mode selection pin (e.g. an enable pin), which is actively supplied with a low level signal during normal operation of the transceiver and thus can be regarded as "virtual ground". In another embodiment the ground pad of the output buffer may be alternatingly connected to at least one mode selection pin, which is currently are a low level, and to the GND pin of the transceiver circuit (in case a mode selection pin that is currently at a low level is not available).

Figure 5:
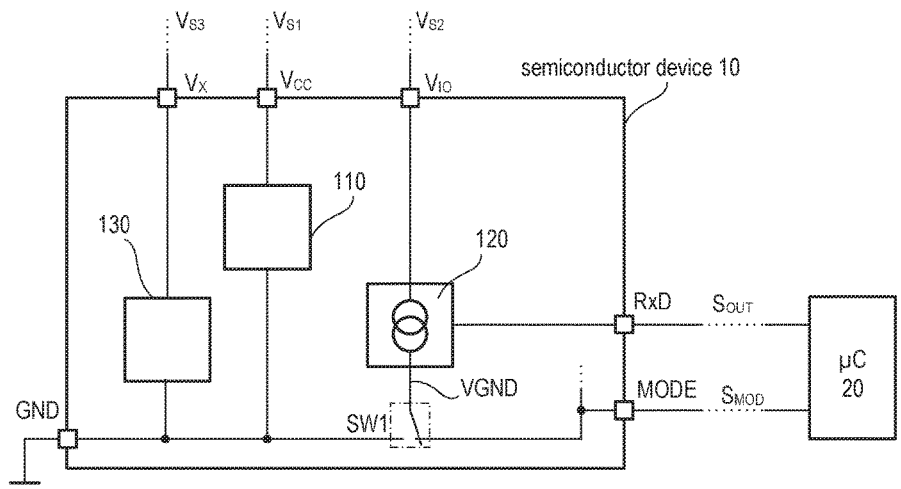
FIG. 5 is a block diagram illustrating one exemplary embodiment of an integrated semiconductor device having at least two supply voltage pins for different supply voltages and a common ground pin.

One general embodiment, in which a specific first circuit (e.g. output buffer of a receiver circuit 120) integrated in a semiconductor device 10 (e.g., a CAN bus transceiver) can be connected to virtual ground while other further circuits (e.g. transmitter circuit 110, further circuitry 130) are permanently connected to the ground pin GND, is illustrated in FIG. 5. Accordingly, the first circuit 120 is connected between supply pin $V_{IO}$ and circuit node VGND (virtual ground), the second circuit 110 is connected between supply pin $V_{CC}$ and ground pin GND. Further (optional) circuits such as the circuit 130 may be connected between a further supply pin $V_X$ (or, alternatively, any internal supply node) and ground pin GND. Thus, the first circuit 120 is supplied with supply voltage $V_{S2}$ applied at supply pin $V_{IO}$, the second circuit 110 is supplied with supply voltage $V_{S1}$ applied at supply pin $V_{CC}$, and the third circuit 130 may be supplied with supply voltage $V_{S3}$, which is either applied at supply pin $V_X$ or provided by any internal supply circuit (not shown). In a more specific example, the semiconductor device is an integrated bus transceiver, wherein the first circuit 120 may be a bus receiver circuit (including an output buffer causing cross conduction currents represented by the current source included in circuit 20), the first circuit 110 may be a bus transmitter circuit (e.g. including driver stage and output stage), and the third circuit 130 may represent all further circuitry included in the bus transceiver, such as a mode selection circuit, a timeout circuit, etc. (see also FIG. 2).

Irrespective of the actual application of the semiconductor device 10, the circuit node VGND (representing virtual ground) may be connected either to the ground pin GND or connected to an input pin, e.g. a mode selection pin MODE of the semiconductor device 10. An electronic switch SW1 may be provided for this purpose. When a low voltage level (equal or close to ground potential) is applied at input pin MODE, the circuit node VGND may be connected to the input pin MODE by switch SW1. Otherwise, when a high voltage level (e.g. equal or close to supply voltage $V_{S2}$) is applied at input pin MODE, the circuit node VGND may be connected to the ground pin GND. The switch SW1 may be implemented using at least one transistor and suitable circuitry for driving the at least one transistor on and off (see also FIG. 8). In an alternative embodiment, the circuit node VGND may be permanently connected to the input pin MODE e.g. by wiring the circuit node VGND to input pin MODE (e.g. on-chip strip line and bond wire). As long as the circuit node VGND is electrically connected to the input pin MODE (and disconnected from the ground pin GND) the circuit loop relevant to the mentioned resonance is disconnected and the resonance peaks shown in FIG. 4 will disappear as well as the electromagnetic emissions caused by those resonance peaks.

The example of FIG. 5 further shows, how the semiconductor device 10 may be connected to a controller circuit such as a micro-controller 20. In the present example, the micro-controller 20 is connected to RxD pin of the semiconductor device 10 to receive an output data signal $S_{OUT}$ from the first circuit 120. Furthermore, the micro-controller 20 is connected to an input pin of the semiconductor device 10, e.g. to mode selection pin MODE to provide a mode selection signal $S_{MOD}$ to the semiconductor device 10. The further processing of the mode selection signal $S_{MOD}$ within the semiconductor device is not shown in the example of FIG. 5 to keep the illustration simple. It may, for example, be supplied to a mode selection circuit similar to the mode control circuit 132 in the example of FIG. 2.

Figure 6:
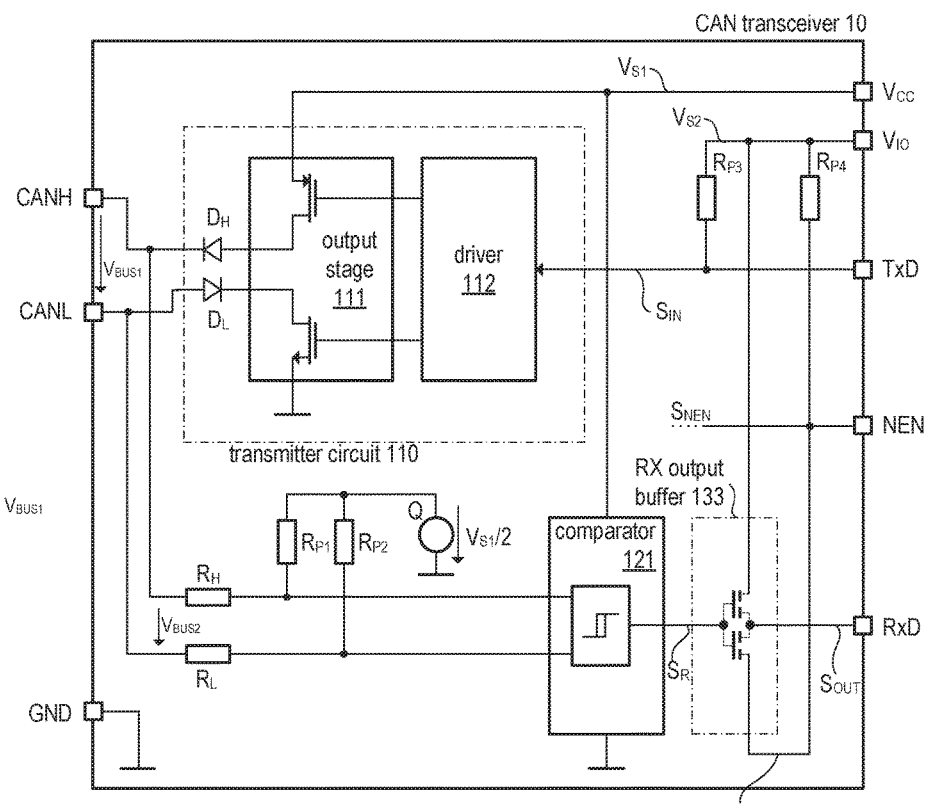
FIG. 6 is a block diagram illustrating one exemplary embodiment of an integrated CAN transceiver circuit described herein.

FIG. 6 illustrates an exemplary embodiment, in which the above-mentioned concept of separate ground pins is implemented. (GND pin and separate virtual ground pad VGND connected to the NEN pin). Similar as the previous example, the transceiver circuit 10 includes a transmitter portion (transmitter circuit 110) as well as a receiver portion (receiver circuit 120). Generally, the transceiver circuit may be used as an interface between the physical bus lines and a controller circuit such as a microcontroller or the like. In case of a CAN bus differential signaling is used, wherein a first bus line is connected to the CANH pin and a second bus line is connected to the CANL pin of the transceiver circuit 10 (optionally via a common-mode choke).

Generally, the transmitter circuit 110 is configured to receive an input data signal $S_{IN}$ at pin RxD and to generate a corresponding (outgoing) first bus signal $V_{BUS1}$, which may be applied to one or more data lines of the bus. As mentioned, two data lines connected to pins CANH and CANL are used in case of a CAN bus. As can be seen in FIG. 6, the transmitter circuit 110 (particularly the output stage 111) is supplied with a first supply voltage $V_{S1}$, which is applied at pin $V_{CC}$, e.g. by an external supply circuit. Moreover, the transmitter circuit 110 is connected to a first ground pad that is connected to a first ground pin GND, at which ground potential is applied as reference potential. The transmitter circuit 110 may include a driver stage 112 and an output stage 111 similar as the example of FIG. 2 and reference is made to the respective description above.

The receiver circuit 120 may be coupled to the mentioned bus lines to receive an (incoming) second bus signal $V_{BUS2}$ therefrom. The second bus signal $V_{BUS2}$ may be generated by another device connected to the bus and is received, e.g. at pins CANH and CANL. Generally, the receiver circuit 120 is configured to generate a receive signal $S_R$ (in the present example at the output of comparator 121) dependent on the second bus signal $V_{BUS2}$. An output buffer 122 is included in the receiver circuit 120. The output buffer 122 receives the receive signal $S_R$ and generates a corresponding output data signal $S_{OUT}$ that is provided at pin RxD. The output buffer 122 is supplied with a second supply voltage $V_{S2}$, which is provided at pin $V_{IO}$. Moreover, the output buffer 122 is connected to a second ground pad VGND that is separate from the first ground pad connected to the GND PIN.

In one embodiment, the receiver circuit may include a comparator circuit 121, which has an input coupled to the data line(s) of the bus (e.g. via resistors $R_H$ and $R_L$) and is configured to compare the second bus signal $V_{BUS2}$ (which is a voltage signal) with at least one threshold value. The comparator circuit 121 may have a hysteresis, which means that two different threshold values $TH_D$ and $TH_R$ are used to discriminate 0-bits from 1-bits. In case of a CAN bus, a 1-bis is signaled by a recessive low level. The pull-up resistors $R_{P1}$ and $R_{P2}$ at the inputs of the comparator circuit 121 pull the common-mode voltage towards the desired value $V_{S1}/2$ (see FIG. 6, bias voltage source Q). The comparator output signal $S_R$ is supplied to the output buffer. The comparator 121 may be implemented in the same way as in the example of FIG. 2 and reference is made to the respective description.

The input pins TxD and NEN may be connected to the supply pin $V_{IO}$ via pull-up resistors $R_{P3}$ and $R_{P4}$, so that the voltage at those pins is pulled towards the second supply voltage $V_{S2}$ if a low-level voltage is not actively applied an the pins (e.g. by a micro controller). The optional mode control circuit, which receives and processes the enable signal $S_{NEN}$ has been omitted for the sake of simplicity. As the virtual ground pad VGND has no electrical connection to the ground pin GND (within the chip including the transceiver circuit 10), any noise injected in the supply pin $V_{IO}$ (e.g. due to an AC current caused by the switching operation of the output buffer 122) will not be coupled into the supply current path between the supply pin $V_{CC}$ and the ground pin GND. Thus, the resonance illustrated in FIG. 4 is destroyed, even if no common-mode choke is coupled between the data lines of the bus and the pins CANH and CANL.

Figure 7:
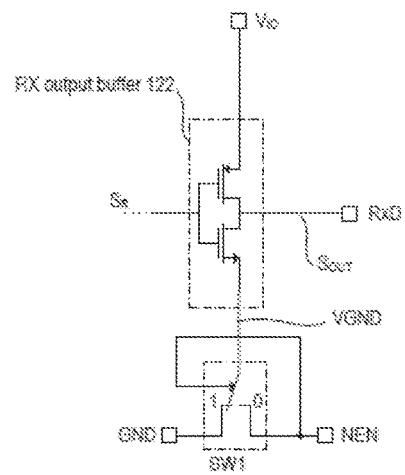
FIG. 7 illustrates a detail of the receiver portion of another exemplary embodiment of a CAN transceiver circuit.
Figures 8A, 8B:
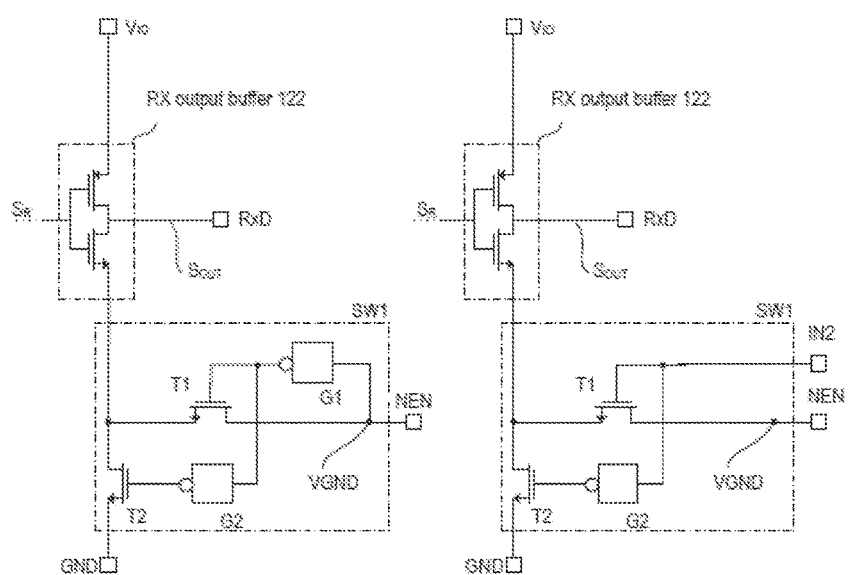
FIGS. 8a-b illustrate one exemplary implementation of the circuit of FIG. 7 (FIG. 8a) and an alternative implementation (FIG. 8b).

In case the transceiver includes a power-down/sleep function, the virtual ground pad VGND may be connected to a controllable switch SW1, which is configured to connect the virtual ground pad VGND either with the NEN pin during normal mode of operation ($S_{EN} \approx 0$ V) or with the GND pin during power-down/sleep mode ($S_{EN} \approx V_{S2}$). In this situation, which is illustrated by the embodiment of FIG. 7, the decoupling between the ground pin GND and the virtual ground pad VGND only exists during normal mode of operation, which is sufficient as no switching induced noise is generated during power-down/sleep mode anyway. FIG. 8a illustrates one exemplary implementation of the controllable switch SW1 of FIG. 7. Accordingly, the output buffer 122 is connected to the NEN pin via transistor T1 and to the ground pin GND via transistor T2, wherein transistor T2 is switched off while transistor T1 is switched on and vice versa. The control electrode (gate in case of a field effect transistor) of transistor T1 is connected to the NEN pin via inverter G1, so that T1 is activated (high level at gate electrode of transistor T1) when the signal $S_{EN}$ at the NEN pin is low ($S_{EN} \approx 0$ V). Inverter G2, which is connected between the control electrode of $T_1$ and the control electrode of $T_2$, ensures that transistor $T_2$ switches inversely to transistor $T_1$. FIG. 8b illustrates an alternative implementation, in which the transistors $T_1$ and $T_2$ (and generally the switch SW1) are controlled based on a further (e.g. binary) input signal, which may be received at a further input pin IN2. In the present example, the virtual ground node VGND is connected either to input pin NEN (e.g. in a first mode of operation) or to the dedicated ground pin GND (e.g. in a second mode of operation) dependent on the further input signal received at pin IN2. Accordingly, the virtual ground node VGND is connected to the NEN pin, when the further input signal at input pin IN2 is at a high level, and to the GND pin, when the further input signal at input pin IN2 is at a low level.

Figure 9:
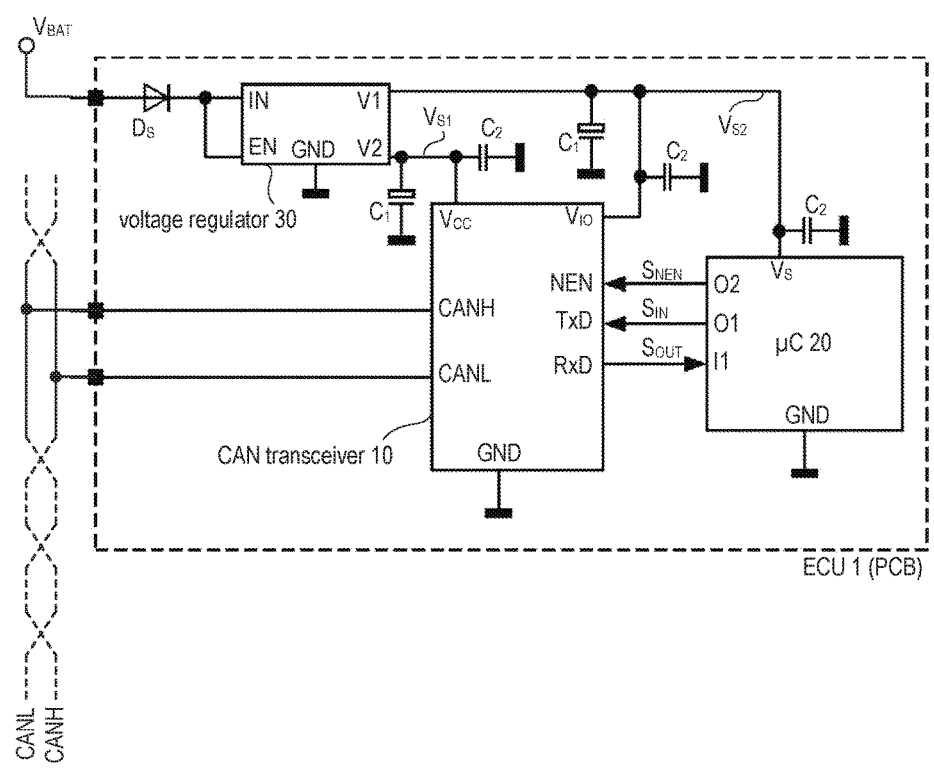
FIG. 9 illustrates a first example of an integrated CAN transceiver circuit included in an electronic control circuit (ECU).

FIG. 9 illustrates an electronic control unit 1 (ECU), which is connected to a CAN bus cable (e.g. a twisted pair cable). The ECU 1 includes, inter alia, a micro controller 20 and an integrated bus transceiver circuit 10 which is an interface between the I/O I1, O1, O2 pins of the micro controller 20 and the physical bus lines. In the present example, the ECU 1 also includes an integrated voltage regulator circuit 30, which has an input being connected, e.g. to an automotive battery (battery voltage $V_{BAT}$, diode $D_S$ is for reverse polarity protection of the ECU 1) and provides two regulated output voltages, e.g. the first supply voltage $V_{S1}$, which is applied to the $V_{CC}$ pin of the transceiver circuit 10, and the second supply voltage $V_{S2}$, which is applied to the $V_{OI}$ pin of the transceiver circuit 10 and the $V_S$ (supply voltage pin) of the microcontroller 20.

The integrated circuits (IC) 10, 20 and 30 may be soldered to a printed circuit board, which may have a highly conductive ground plane, to which the ground pins of the ICs 10, 20 and 30 are connected. Buffer capacitors C1 and C2 may be connected between the ground plane and the supply rails, at which the supply voltages $V_{S1}$ and $V_{S2}$ are provided by the voltage regulator circuit 30. The RxD pin of the transceiver circuit 10 may be connected to an input pin I1 of the microcontroller 20, and the TxD and NEN pins of the transceiver circuit 10 may be connected to respective output pins O1 and O2 of the microcontroller 20. A single-ended input data signal $S_{IN}$ generated by the microcontroller 20 at output pin O1 is applied at the TxD pin of the transceiver circuit 10 and converted into a differential bus signal between the pins CANH and CANL connected to the data lines of the bus. Similarly, a differential bus signal received e.g. from another ECU via the bus is converted into a single-ended output data signal $S_{OUT}$ provided at the RxD pin of the transceiver circuit 10 and applied at the input pin I1 of the microcontroller 20. In the present example, the transceiver circuit may be put into a power-down or sleep mode when the microcontroller generates a high-level signal $S_{NEN}$ at the NEN pin of the transceiver circuit 10. Conversely, a mode change of the mode of operation of the transceiver circuit 10 may be initiated by the microcontroller 20, e.g. by generating low-level signal $S_{NEN}$ at the NEN pin of the transceiver circuit 10 thus enabling normal operation of the transceiver 10. During normal operation of the transceiver circuit 10, the NEN pin may be connected to a virtual ground pad VGND provided in the integrated transceiver circuit as shown in the example of FIG. 6.

Figure 10:
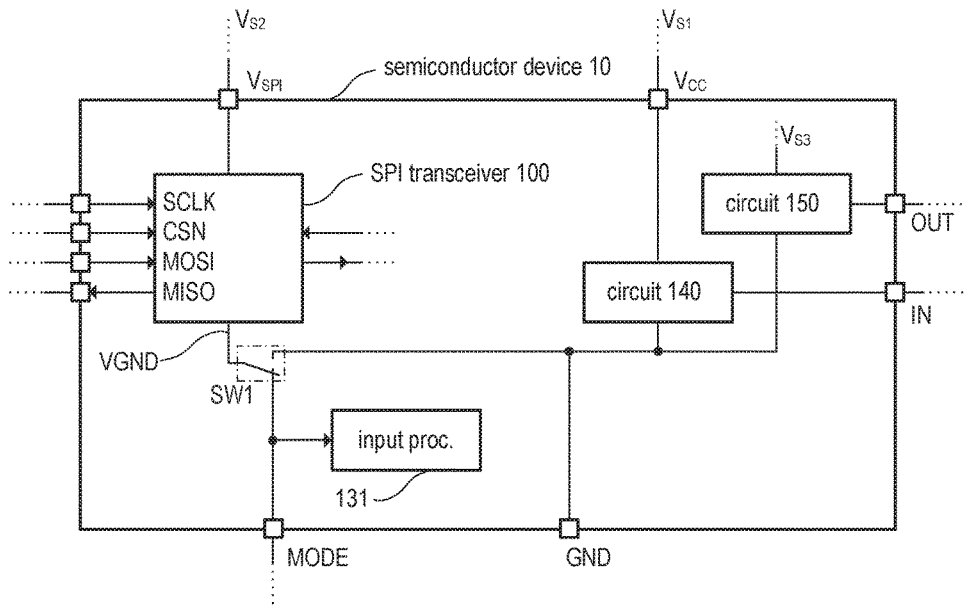
FIG. 10 illustrates another exemplary embodiment, which is a semiconductor device including an SPI transceiver circuit.

The examples illustrated above relate to a CAN transceiver circuit integrated in a semiconductor chip. As mentioned, the present disclosure is not limited to applications related to CAN. FIG. 10 illustrates a further example of a semiconductor device 10 including a transceiver circuit 100 operating as an interface between a Serial Peripheral Interface (SPI) bus and further circuitry (e.g. a micro controller). Like the generic embodiment of FIG. 5, the semiconductor device 10 may be a semiconductor chip arranged in a chip package including several pins (input pins, output pins, supply pins, etc.). The SPI bus may be used for synchronous (using a bus clock) serial data transfer in fill-duplex mode. Accordingly, an SPI bus interface includes usually four pins (for a four-wire bus), a data input pin (for receiving data from a bus master device), a data output pin (for sending data to a bus master device), a clock pin (for receiving the bus clock signal from the bus master device) and a chip select pin (to allow the bus master device to address a specific bus slave device). For a bus slave device, the data input pin is usually referred to as MOSI pin (master-out/slave-in), the data output pin is usually referred to as MISO pin (master-on/slave-out), the bus clock pin is referred to as SCLK pin, and the chip select pin is referred to as CSN pin (Chip Select Not) or /SS pin (inverted Slave Select). As indicated by its name, the CSN pins are actively driven to a low level to address the respective bus slave devices. The SPI standard is as such known and thus not further discussed here.

In the example of FIG. 10, the semiconductor device includes an SPI transceiver circuit 100, which may be composed of a receiver portion and a transmitter portion as shown in the previous example of FIG. 5 (transmitter circuit 110, receiver circuit 120). The SPI transceiver circuit 100 is supplied by a supply voltage $V_{S2}$, which is applied to the semiconductor device at pin $V_{SPI}$, to which the SPI transceiver circuit 100 is connected. Furthermore, the SPI transceiver circuit 100 is connected to virtual ground at circuit node VGND, which can be connected (using a switch SW1) either to a mode selection pin MODE of the semiconductor device 10 or to a dedicated ground pin GND of the semiconductor device 10. The switch SW1 may include at least one transistor or other electronic switches as well as circuitry for driving the transistor (see, e.g., the example of FIG. 8). The mode selection pin MODE may be configured to receive, for example, an enable signal such as the signal $S_{NEN}$ in the previous examples. The mode selection pin MODE (or generally an input pin) may also be supplied to a circuit 131 that is configured to process the mode selection signal (or generally an input signal). The circuit 131 may be, for example, a mode control circuit similar to the circuit 132 in the example of FIG. 1.

Other circuits may be included in the semiconductor device 10 for various purposes. In the example of FIG. 10, circuit 140 is connected to pins $V_{CC}$ and GND and thus supplied by supply voltage $V_{S1}$. The circuit 140 may receive and input signal from an external device (e.g. a microcontroller) via pin IN. A further circuit 150 may be included in the semiconductor device 10. In the present example, the circuit 150 generates an output signal, which is provided at output pin OUT to an external device (e.g. the microcontroller). The circuit 150 may be supplied by supply voltage $V_{S1}$ or $V_{S2}$ provided at supply pins $V_{SPI}$ and $V_{CC}$, respectively, or by supply voltage $V_{S3}$ generated by an internal supply circuit (not shown in FIG. 10) included in FIG. 10.

Figure 11:
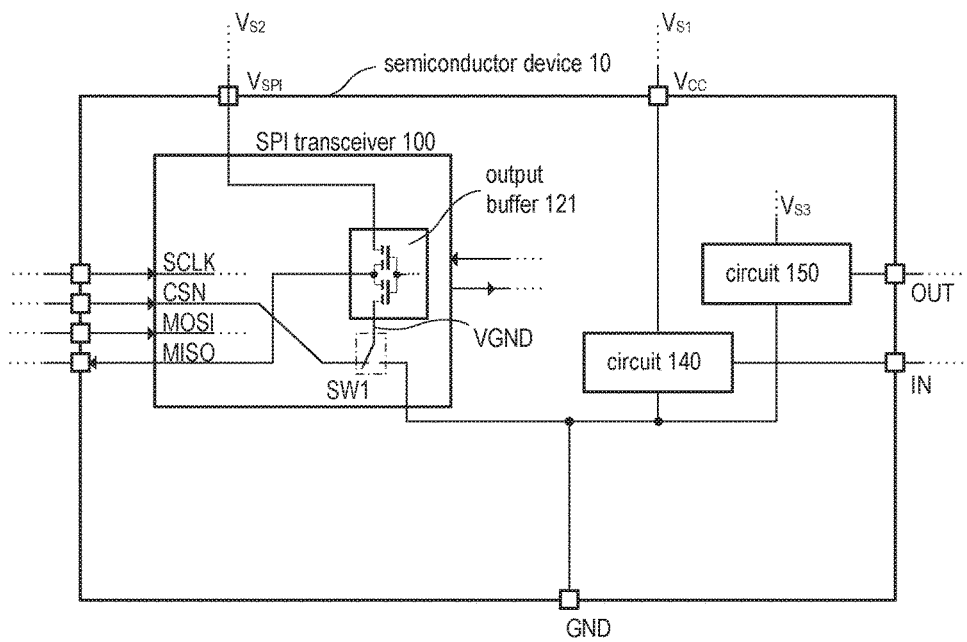
FIG. 11 illustrates a further embodiment including an SPI transceiver, wherein the chip select (CSN) input pin is temporarily used as virtual ground at least for the output buffer that drives the data output (MISO) pin of the SPI transceiver.

FIG. 11 illustrates a further embodiment of a semiconductor device including an SPI transceiver circuit 100. The example of FIG. 11 is essentially the same as the previous example of FIG. 10 except that the circuit node VGND (virtual ground) can be connected to the CSN pin of the semiconductor device 10 (instead of mode selection pin MODE). Using switch SW1 the circuit node VGND is either connected to the CSN pin (while a low level signal is applied to the CSN pin) or to the dedicated ground pin GND. As mentioned, the CSN pin is used to receive a chip select signal, which has a purpose similar to the enable signal $S_{NEN}$ used in the examples of FIGS. 2 and 6. According to the SPI standard the CSN pin must be actively driven to a low level in order to address the SPI transceiver circuit.

Figure 12:
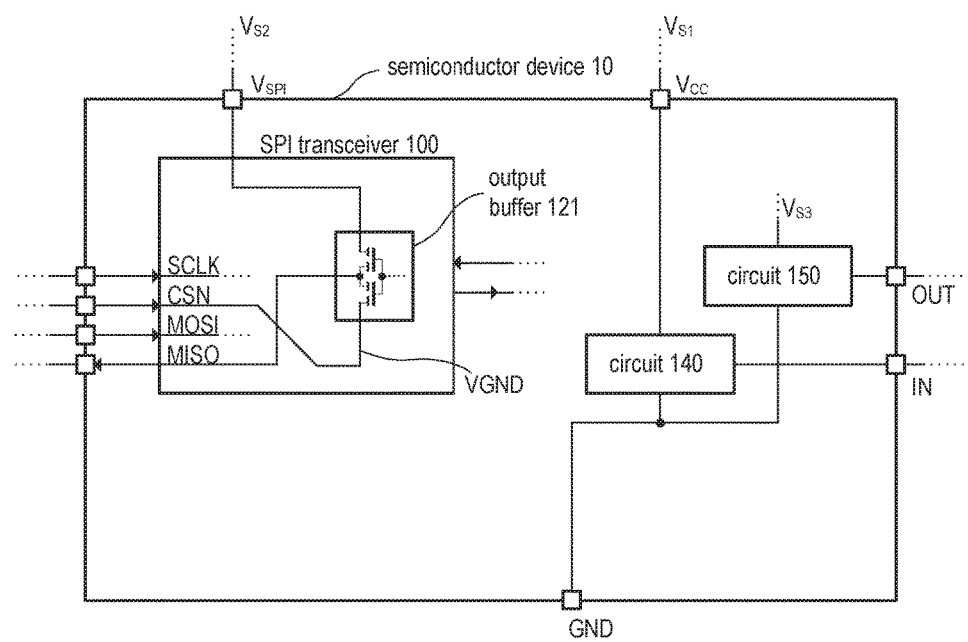
FIG. 12 illustrates an alternative embodiment including an SPI transceiver, wherein the chip select (CSN) input pin is permanently used as virtual ground at least for the output buffer that drives the data output (MISO) pin of the SPI transceiver.

FIG. 12 illustrates a further embodiment of a semiconductor device including an SPI transceiver circuit 100. The example of FIG. 12 is essentially the same as the previous example of FIG. 11 except that the circuit node VGND (virtual ground) is permanently connected to the CSN pin. Thus, the switch SW1 may be omitted. As long the voltage level applied at the CSN pin (by the bus master device) is high, the output buffer 121 is inoperative. However, this is not a problem in many applications, as the output buffer 121 may be not needed when the chip select signal indicates that the chip is not selected for data transmission across the SPI bus.

The following examples demonstrate one or more aspects of this disclosure and may be combined in any way.

EXAMPLE 1

A semiconductor device comprising:
a chip package including at least one semiconductor chip, a dedicated ground pin, a first supply pin for receiving a first supply voltage, a second supply pin for receiving a second supply voltage, and a first input pin;
a first circuit integrated in the semiconductor chip, the first circuit being coupled to the first supply pin and to the ground pin, a second circuit integrated in the semiconductor chip, the second circuit being coupled to the first supply pin and to a virtual ground node, and an electronic switch which is configured to connect the virtual ground node with the first input pin dependent on the level of a first input signal.

EXAMPLE 2

The semiconductor device of example 1,
wherein the first input signal is received at the first input pin, and
wherein the electronic switch is configured to connect the virtual ground node with either the first input pin or the dedicated ground pin dependent on the input signal.

EXAMPLE 3

The semiconductor device of any of examples 1-2 or combinations thereof,
wherein the electronic switch is configured to connect the virtual ground node with the first input pin when the first input signal received at the first input pin is at a low level.

EXAMPLE 4

The semiconductor device of any of examples 1-3 or combinations thereof,
wherein the electronic switch is configured to connect the virtual ground node with the dedicated ground pin when the first input signal received at the first input pin is not at a low level.

EXAMPLE 5

The semiconductor device of example 3 or 4,
wherein the low level is substantially equal to the level present at the dedicated ground pin.

EXAMPLE 6

The semiconductor device of any of examples 1-5 or combinations thereof,
wherein a second supply current passes through the second circuit from the second supply pin to the virtual ground node, while the voltage drop across the second circuit substantially corresponds to the second supply voltage.

EXAMPLE 7

The semiconductor device of any of examples 1-6 or combinations thereof,
wherein the first input pin is a mode selection pin and the first input signal is a mode selection signal indicative of an operation mode of the semiconductor device.

EXAMPLE 8

The semiconductor device of examples 1-7 or combinations thereof,
wherein the second circuit includes an output buffer circuit configured to generate an output signal at an output pin of the semiconductor chip, the output buffer circuit being supplied via the second supply pin and the virtual ground node.

EXAMPLE 9

The semiconductor device of any of examples or combinations thereof,
wherein the first input pin is a mode selection pin and the first input signal is a mode selection signal indicative of an operation mode of the semiconductor device, and
wherein the virtual ground node is connected to the mode selection pin, when the mode selection signal is at a low level.

EXAMPLE 10

The semiconductor device of any of examples 1-9 or combinations thereof,
wherein the first circuit includes an transmitter circuit configured to generate a first bus signal provided at at least one bus pin of the semiconductor chip.

EXAMPLE 11

The semiconductor device of any of examples 1-10 or combinations thereof,
wherein the second circuit includes is a receiver circuit including an output buffer circuit that is configured to generate an output signal at an output pin of the semiconductor chip based on a second bus signal received from the at least one bus pin.

EXAMPLE 12

A semiconductor device comprising:
a chip package including at least one semiconductor chip,
a dedicated ground pin, a first supply pin for receiving a first supply voltage, a second supply pin for receiving a second supply voltage, a first input pin for receiving an input signal;
a first circuit integrated in the semiconductor chip, the first circuit being coupled to the first supply pin and to the ground pin,
a second circuit integrated in the semiconductor chip, the second circuit being coupled to the first supply pin and to a virtual ground node,
wherein the virtual ground node is at least temporarily connected to the first input pin, and
wherein—when the virtual ground node is connected to the first input pin and the first input signal received at the first input pin is at a low voltage level—a second supply current passes through the second circuit from the second supply pin to the virtual ground node, while the voltage drop across the second circuit substantially corresponds to the second supply voltage.

EXAMPLE 13

The semiconductor device of example 12, further comprising:
a wired connection between the virtual ground node and the first input pin.

EXAMPLE 14

The semiconductor device of any of examples 12-13 or combinations thereof, further comprising:
an electronic switch which is configured to connect the virtual ground node either with the first input pin or with the dedicated ground pin dependent on the level of the input signal received at the input pin.

EXAMPLE 15

The semiconductor device of any of examples 12-14 or combinations thereof,
wherein a second supply current passes through the second circuit from the second supply pin to the virtual ground node, while the voltage drop across the second circuit substantially corresponds to the second supply voltage.

EXAMPLE 16

The semiconductor device of any of examples 12-15 or combinations thereof,
wherein the first input pin is a mode selection pin and the first input signal is a mode selection signal indicative of an operation mode of the semiconductor device.

EXAMPLE 17

The semiconductor device of any combination of examples 12-16 or combinations thereof,
wherein the second circuit includes an output buffer circuit configured to generate an output signal at an output pin of the semiconductor chip, the output buffer circuit being supplied via the second supply pin and the virtual ground node.

EXAMPLE 18

The semiconductor device of any combination of examples 12-17 or combinations thereof,
wherein the first input pin is a mode selection pin and the first input signal is a mode selection signal indicative of an operation mode of the semiconductor device, and
wherein the virtual ground node is connected to the mode selection pin, when the mode selection signal is at a low level.

EXAMPLE 19

The semiconductor device of any combination of examples 12-18 or combinations thereof,
wherein the first circuit includes an transmitter circuit configured to generate a first bus signal provided at at least one bus pin of the semiconductor chip.

EXAMPLE 20

The semiconductor device of any of claims 12-19 or combinations thereof,
wherein the second circuit includes is a receiver circuit including an output buffer circuit that is configured to generate an output signal at an output pin of the semiconductor chip based on a second bus signal received from the at least one bus pin.

EXAMPLE 21

A bus transceiver circuit comprising:
a transmitter portion configured to receive a input data signal and to generate a corresponding first bus signal operably applied to at least one bus line; the transmitter portion of the transceiver circuit being supplied with a first supply voltage and connected to a first ground pad;
a receiver portion operably coupled to the at least one bus line to receive a second bus signal and configured to generate a corresponding receive signal; and
an output buffer included in the receiver portion of the transceiver circuit, the output buffer receiving the receive signal and generating a corresponding output data signal, the output buffer being supplied with a second supply voltage and connected to a second ground pad that is separate from the first ground pad.

EXAMPLE 22

The bus transceiver circuit of example 21,
wherein the receiver portion of the transceiver circuit comprises a comparator circuit receiving the second bus signal and configured to compare the second bus signal with at least one threshold; the comparator being configured to generate the receive signal being indicative of the result of the comparison.

EXAMPLE 23

The bus transceiver circuit of example 21 or 22 or combinations thereof,
wherein the comparator circuit is supplied with the first supply voltage and connected to the first ground pad.

EXAMPLE 24

The bus transceiver circuit of any of examples 21-23 or combinations thereof,
wherein the bus transceiver circuit includes a first supply pin for applying the first supply voltage and a second supply pin for applying the second supply voltage.

EXAMPLE 25

The bus transceiver circuit of any of examples 21-24 or combinations thereof,
wherein the bus transceiver circuit includes a first ground pin connected to the first ground pad and a second ground pin connected to the second ground pad.

EXAMPLE 26

The bus transceiver circuit of any of examples 21-25,
wherein the bus transceiver circuit includes a first ground pin connected to the first ground pad and a further pin, which, at least during a normal mode of operation of the transceiver circuit, is connected to the second ground pad and supplied with a low level signal.

EXAMPLE 27

The bus transceiver circuit of any of examples 21-26 or combinations thereof, further comprising:
a controllable switch that is configured to connect—dependent on the voltage level present at the further pin—the second ground pad either to the first ground pin or to the further pin.

EXAMPLE 28

The bus transceiver circuit of any of examples 21-27 or combinations thereof, wherein the bus transceiver circuit is configured to operate in a sleep mode and in a normal mode, the normal mode being indicated by a specific voltage level applied to a further pin of the transceiver circuit; and wherein, at least in normal mode, the second ground pad is connected to the further pin.

EXAMPLE 29

A transceiver device for interfacing with a data bus, the device comprising:

a chip package having at least a first supply pin, a second supply pin, a ground pin, an input data pin, an output data pin, at least one bus pin for connecting at least one bus line, and a further pin; and a semiconductor chip including a receiver circuit and a transmitter circuit, wherein the transmitter circuit is configured to receive a input data signal at the input data pin and to provide a corresponding first bus signal at the at least one bus pin; the transmitter circuit being supplied with a first supply voltage applied at the first supply pin and being connected to the first ground pin;

wherein the receiver circuit is operably coupled to the at least one bus pin to receive a second bus signal and configured to generate a corresponding receive signal; and wherein the receiver circuit includes an output buffer that receives the receive signal and generates a corresponding output data signal at the output data pin, the output buffer being supplied with a second supply voltage applied at the second supply pin and being connected to a circuit node, which is configured to be connected to the further pin.

EXAMPLE 30

The transceiver device of example 29, wherein at least during a normal operation of the device the circuit node is connected to the further pin that is operably supplied with a low level signal during normal operation.

EXAMPLE 31

A method executed in a semiconductor device that comprises:

a chip package including at least one semiconductor chip, a dedicated ground pin, a first supply pin for receiving a first supply voltage, a second supply pin for receiving a second supply voltage, and a first input pin;

a first circuit integrated in the semiconductor chip, the first circuit being coupled to the first supply pin and to the ground pin; and a second circuit integrated in the semiconductor chip, the second circuit being coupled to the first supply pin and to a virtual ground node;

wherein the method comprises:

receiving a first input signal at the first input pin; and connecting, using an electronic switch, the virtual ground node with the first input pin dependent on the level of a first input signal.

EXAMPLE 32

The method of example 31, the method further comprising:

receiving the first input signal at the first input pin, and connecting, using the electronic switch, the virtual ground node either with the first input pin or with the dedicated ground pin dependent on the level of the first input signal.

EXAMPLE 33

The method of any of examples claim 31-32 or combinations thereof, wherein connecting the virtual ground node comprises:

evaluating the voltage level of the first input signal;

if the voltage level of the first input signal is a low level: connecting the virtual ground node with the first input pin; and if the voltage level of the first input signal is not a low level: connecting the virtual ground node with the dedicated ground pin.

EXAMPLE 34

A system comprising:

a controller device comprising an output pin; and a semiconductor device, which comprises:

a chip package including at least one semiconductor chip, a dedicated ground pin, a first supply pin for receiving a first supply voltage, a second supply pin for receiving a second supply voltage, a first input pin connected to the output pin of the controller device;

a first circuit integrated in the semiconductor chip, the first circuit being coupled to the first supply pin and to the ground pin, a second circuit integrated in the semiconductor chip, the second circuit being coupled to the first supply pin and to a virtual ground node, and an electronic switch which is configured to connect the virtual ground node with the first input pin dependent on the level of a input signal.

EXAMPLE 35

The system of example 34, wherein the first input pin connected to the output pin of the controller device is configured to receive the input signal from the controller device.

Although this disclosure has been illustrated and described with respect to one or more implementations, alterations and/or modifications may be made to the illustrated examples without departing from the spirit and scope of the appended claims. In particular regard to the various functions performed by the above described components or structures units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of this disclosure.

In addition, while a particular feature of this disclosure may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

I claim:

1. A semiconductor device comprising:
a chip package including at least one semiconductor chip, a dedicated ground pin, a first supply pin for receiving a first supply voltage, a second supply pin for receiving a second supply voltage, and a first input pin;
a first circuit integrated in the semiconductor chip, the first circuit being coupled to the first supply pin and to the dedicated ground pin;
a second circuit integrated in the semiconductor chip, the second circuit being coupled to the first supply pin and to a virtual ground node; and
an electronic switch configured to connect the virtual ground node with the first input pin dependent on a level of a first input signal.

2. The semiconductor device of claim 1,
wherein the first input signal is received at the first input pin, and
wherein the electronic switch is configured to connect the virtual ground node with either the first input pin or the dedicated ground pin dependent on the input signal.

3. The semiconductor device of claim 1, wherein the electronic switch is configured to connect the virtual ground node with the first input pin when the first input signal received at the first input pin is at a low level.

4. The semiconductor device of claim 1, wherein the electronic switch is configured to connect the virtual ground node with the dedicated ground pin when the first input signal received at the first input pin is not at a low level.

5. The semiconductor device of claim 3, wherein the low level is substantially equal to a level present at the dedicated ground pin.

6. The semiconductor device of claim 1, wherein a second supply current passes through the second circuit from the second supply pin to the virtual ground node, while the voltage drop across the second circuit substantially corresponds to the second supply voltage.

7. The semiconductor device of claim 1, wherein the first input pin is a mode selection pin and the first input signal is a mode selection signal indicative of an operation mode of the semiconductor device.

8. The semiconductor device of claim 1, wherein the second circuit includes an output buffer circuit configured to generate an output signal at an output pin of the semiconductor chip, the output buffer circuit being supplied via the second supply pin and the virtual ground node.

9. The semiconductor device of claim 8,
wherein the first input pin is a mode selection pin and the first input signal is a mode selection signal indicative of an operation mode of the semiconductor device, and
wherein the virtual ground node is connected to the mode selection pin, when the mode selection signal is at a low level.

10. The semiconductor device of claim 1, wherein the first circuit includes a transmitter circuit configured to generate a first bus signal provided at at least one bus pin of the semiconductor chip.

11. The semiconductor device of claim 10, wherein the second circuit includes a receiver circuit including an output buffer circuit configured to generate an output signal at an output pin of the semiconductor chip based on a second bus signal received from the at least one bus pin.

12. A semiconductor device comprising:
a chip package including at least one semiconductor chip, a dedicated ground pin, a first supply pin for receiving a first supply voltage, a second supply pin for receiving a second supply voltage, a first input pin for receiving an input signal;
a first circuit integrated in the semiconductor chip, the first circuit being coupled to the first supply pin and to the dedicated ground pin; and
a second circuit integrated in the semiconductor chip, the second circuit being coupled to the first supply pin and to a virtual ground node,
wherein the virtual ground node is at least temporarily connected to the first input pin, and
wherein, when the virtual ground node is connected to the first input pin and the input signal received at the first input pin is at a low voltage level, a second supply current passes through the second circuit from the second supply pin to the virtual ground node, while a voltage drop across the second circuit substantially corresponds to the second supply voltage.

13. The semiconductor device of claim 12, further comprising a wired connection between the virtual ground node and the first input pin.

14. The semiconductor device of claim 12, further comprising an electronic switch configured to connect the virtual ground node either with the first input pin or with the dedicated ground pin dependent on a level of the input signal received at the input pin.

15. The semiconductor device of claim 12, wherein a second supply current passes through the second circuit from the second supply pin to the virtual ground node, while the voltage drop across the second circuit substantially corresponds to the second supply voltage.

16. The semiconductor device of claim 12, wherein the first input pin is a mode selection pin and the first input signal is a mode selection signal indicative of an operation mode of the semiconductor device.

17. The semiconductor device of claim 12, wherein the second circuit includes an output buffer circuit configured to generate an output signal at an output pin of the semiconductor chip, the output buffer circuit being supplied via the second supply pin and the virtual ground node.

18. The semiconductor device of claim 17,
wherein the first input pin is a mode selection pin and the first input signal is a mode selection signal indicative of an operation mode of the semiconductor device, and
wherein the virtual ground node is connected to the mode selection pin, when the mode selection signal is at a low level.

19. The semiconductor device of claim 12, wherein the first circuit includes a transmitter circuit configured to generate a first bus signal provided at at least one bus pin of the semiconductor chip.

20. The semiconductor device of claim 19, wherein the second circuit includes is a receiver circuit including an output buffer circuit that is configured to generate an output signal at an output pin of the semiconductor chip based on a second bus signal received from the at least one bus pin.

21. A bus transceiver circuit comprising:
a transmitter portion configured to receive an input data signal and to generate a corresponding first bus signal operably applied to at least one bus line; the transmitter portion of the transceiver circuit being supplied with a first supply voltage and connected to a first ground pad;
a receiver portion operably coupled to the at least one bus line to receive a second bus signal and configured to generate a corresponding receive signal; and an output buffer included in the receiver portion of the transceiver circuit, the output buffer receiving the receive signal and generating a corresponding output data signal, the output buffer being supplied with a second supply voltage and connected to a second ground pad that is separate from the first ground pad.

22. The bus transceiver circuit of claim 21, wherein the receiver portion of the transceiver circuit comprises a comparator circuit receiving the second bus signal and configured to compare the second bus signal with at least one threshold; the comparator being configured to generate the receive signal being indicative of the result of the comparison.

23. The bus transceiver circuit of claim 22, wherein the comparator circuit is supplied with the first supply voltage and connected to the first ground pad.

24. The bus transceiver circuit of claim 21, wherein the bus transceiver circuit includes a first supply pin for applying the first supply voltage and a second supply pin for applying the second supply voltage.

25. The bus transceiver circuit of claim 21, wherein the bus transceiver circuit includes a first ground pin connected to the first ground pad and a second ground pin connected to the second ground pad.

26. The bus transceiver circuit of claim 21, wherein the bus transceiver circuit includes a first ground pin connected to the first ground pad and a further pin, which, at least during a normal mode of operation of the transceiver circuit, is connected to the second ground pad and supplied with a low level signal.

27. The bus transceiver circuit of claim 26, further comprising a controllable switch that is configured to connect, dependent on a voltage level present at the further pin, the second ground pad either to the first ground pin or to the further pin.

28. The bus transceiver circuit of claim 21,
wherein the bus transceiver circuit is configured to operate in a sleep mode and in a normal mode, the normal mode being indicated by a specific voltage level applied to a further pin of the transceiver circuit, and
wherein, at least in normal mode, the second ground pad is connected to the further pin.

29. A transceiver device for interfacing with a data bus, the device comprising:
a chip package having at least a first supply pin, a second supply pin, a ground pin, an input data pin, an output data pin, at least one bus pin for connecting at least one bus line, and a further pin; and
a semiconductor chip including a receiver circuit and a transmitter circuit,
wherein the transmitter circuit is configured to receive an input data signal at the input data pin and to provide a corresponding first bus signal at the at least one bus pin; the transmitter circuit being supplied with a first supply voltage applied at the first supply pin and being connected to the ground pin,
wherein the receiver circuit is operably coupled to the at least one bus pin to receive a second bus signal and configured to generate a corresponding receive signal, and
wherein the receiver circuit includes an output buffer that receives the receive signal and generates a corresponding output data signal at the output data pin, the output buffer being supplied with a second supply voltage applied at the second supply pin and being connected to a circuit node, which is configured to be connected to the further pin.

30. The transceiver device of claim 29, wherein at least during a normal operation of the device the circuit node is connected to the further pin that is operably supplied with a low level signal during normal operation.

31. A method executed in a semiconductor device that comprises:
a chip package including at least one semiconductor chip, a dedicated ground pin, a first supply pin for receiving a first supply voltage, a second supply pin for receiving a second supply voltage, and a first input pin;
a first circuit integrated in the semiconductor chip, the first circuit being coupled to the first supply pin and to the dedicated ground pin; and
a second circuit integrated in the semiconductor chip, the second circuit being coupled to the first supply pin and to a virtual ground node;
wherein the method comprises:
receiving a first input signal at the first input pin; and
connecting, using an electronic switch, the virtual ground node with the first input pin dependent on a level of a first input signal.

32. The method of claim 31, further comprising:
receiving the first input signal at the first input pin; and
connecting, using the electronic switch, the virtual ground node either with the first input pin or with the dedicated ground pin dependent on the level of the first input signal.

33. The method of claim 31, wherein the level of the first input signal is a voltage level of the first input signal, and wherein connecting the virtual ground node comprises:
evaluating the voltage level of the first input signal;
if the voltage level of the first input signal is a low level: connecting the virtual ground node with the first input pin; and
if the voltage level of the first input signal is not a low level: connecting the virtual ground node with the dedicated ground pin.

34. A system comprising:
a controller device comprising an output pin; and
a semiconductor device, comprising:
a chip package including at least one semiconductor chip, a dedicated ground pin, a first supply pin for receiving a first supply voltage, a second supply pin for receiving a second supply voltage, a first input pin connected to the output pin of the controller device;
a first circuit integrated in the semiconductor chip, the first circuit being coupled to the first supply pin and to the dedicated ground pin;
a second circuit integrated in the semiconductor chip, the second circuit being coupled to the first supply pin and to a virtual ground node; and
an electronic switch configured to connect the virtual ground node with the first input pin dependent on a level of an input signal.

35. The system of claim 34, wherein the first input pin connected to the output pin of the controller device is configured to receive the input signal from the controller device.

* * * * *